(12) United States Patent
Moue et al.

(10) Patent No.: US 11,212,471 B2
(45) Date of Patent: Dec. 28, 2021

(54) SOLID-STATE IMAGE CAPTURING ELEMENT AND ELECTRONIC DEVICE

(71) Applicant: Sony Semiconductor Solutions Corporation, Kanagawa (JP)

(72) Inventors: Takashi Moue, Kanagawa (JP); Takeshi Etou, Fukuoka (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/269,036

(22) PCT Filed: Sep. 6, 2019

(86) PCT No.: PCT/JP2019/035240
§ 371 (c)(1),
(2) Date: Feb. 17, 2021

(87) PCT Pub. No.: WO2020/054629
PCT Pub. Date: Mar. 19, 2020

(65) Prior Publication Data
US 2021/0185250 A1 Jun. 17, 2021

(30) Foreign Application Priority Data
Sep. 13, 2018 (JP) .............................. JP2018-171964

(51) Int. Cl.
*H04N 5/378* (2011.01)
*H04N 5/357* (2011.01)

(52) U.S. Cl.
CPC ............. *H04N 5/357* (2013.01); *H04N 5/378* (2013.01)

(58) Field of Classification Search
CPC .... H04N 5/357; H04N 5/3577; H04N 5/3765; H04N 5/378; H03M 1/08; H03M 1/56; H03K 5/08; H03K 5/2481
See application file for complete search history.

(56) References Cited

U.S. PATENT DOCUMENTS

2009/0033759 A1* 2/2009 Wakabayashi ......... H04N 5/335
348/222.1
2017/0230599 A1* 8/2017 Abiru ..................... H04N 5/378
(Continued)

FOREIGN PATENT DOCUMENTS

JP 2013-126015 A 6/2013
WO 2017/030007 A1 2/2017
(Continued)

OTHER PUBLICATIONS

International Search Report (PCT/ISA/210), International Application No. PCT/JP2019/035240, dated Nov. 21, 2019.
(Continued)

*Primary Examiner* — Lin Ye
*Assistant Examiner* — Chriss S Yoder, III
(74) *Attorney, Agent, or Firm* — Michael Best & Friedrich LLP (57) ABSTRACT

Solid-state image capturing elements are disclosed. In one example, a solid-state image capturing element includes a noise-cancelling-signal generating circuit connected to a pixel power source. It executes a gain change and a polarity inversion on a first noise cancelling signal to output a second noise cancelling signal. The element also includes a DA converter that outputs a reference signal and converts a current of the second noise cancelling signal into a voltage to superpose the converted voltage on the reference signal; a comparator that receives inputs of the reference signal and a pixel signal and outputs an inversion signal according to the pixel signal and a gain setting; a counter that converts an inversion timing of the comparator into a digital value; and a gain controlling unit that outputs, when changing a gradient of the reference signal and an input capacity to execute a gain control on the comparator.

6 Claims, 7 Drawing Sheets

(56) References Cited

U.S. PATENT DOCUMENTS

2018/0234649 A1* 8/2018 Matsuura .............. H04N 5/3575
2019/0068902 A1* 2/2019 Nishino ................. H04N 5/341

FOREIGN PATENT DOCUMENTS

WO      2017/159394 A1    9/2017
WO   WO-2018159343 A1    9/2018

OTHER PUBLICATIONS

Notification of Transmittal of the International Search Report and the Written Opinion of the International Searching Authority, or the Declaration (PCT/ISA/220), International Application No. PCT/JP2019/034717, dated Dec. 3, 2019.

* cited by examiner

SOLID-STATE IMAGE CAPTURING ELEMENT AND ELECTRONIC DEVICE

FIELD

The present disclosure relates to a solid-state image capturing element and an electronic device.

BACKGROUND

Recently, a solid-state image capturing element, such as a Complementary Metal Oxide Semiconductor (CMOS) image sensor obtained by applying thereto a semiconductor microfabrication processing technology, is broadly employed for digital cameras, smartphones, etc.

In such an image capturing element, in a photodiode provided in a pixel, incident light from an object is photoelectrically converted, a voltage signal that is according to an amount of electric charge obtained as a result thereof is read via an amplifying transistor and a vertical signal line, and the signal is Analog-to-Digital-converted (AD-converted) by a comparator (see Patent Literature 1, for example).

Incidentally, in the above-mentioned image capturing element, due to characteristics of pixels, there present a parasitic capacity between nodes in pixels and a noise of a pixel power source that propagates into a vertical signal line via an amplifying transistor to deteriorate the image quality, and thus a noise removing circuit has been provided in order to remove the noise of the pixel power source.

The above-mentioned conventional noise removing circuit is configured to take in noise of a pixel power source, convert the taken noise into current having appropriate gain and frequency characteristics, cause the current to flow into an output resistance of a D/A converter for generating ramp wave so as to return the current to voltage, and offset the noise in a differential pair of a comparator.

CITATION LIST

Patent Literature

Patent Literature 1: JP 2015-233184 A

SUMMARY

Technical Problem

However, when an ultra-low comparator (ULVCM: Ultra Low Voltage Comparator) is employed for a comparator, an input capacity is different between a pixel side and a D/A converter side, and a pixel signal and an output signal of a D/A converter are input into the same side of a differential pair, and thus, different from the conventional one, there presents a problem that the configuration for offsetting noise in a differential pair of a comparator is not able to be employed.

An object of the present disclosure is to provide a solid-state image capturing element and an electronic device capable of removing a pixel-power-source noise and reducing conversion error even when an ultra-low comparator is employed as a comparator, so as to reduce deterioration in image quality.

Solution to Problem

According to the present disclosure, a solid-state image capturing element includes: a pixel; a noise-cancelling-signal generating circuit connected to a pixel power source that supplies electric power to the pixel, the noise-cancelling-signal generating circuit configured to generate a first noise cancelling signal for cancelling a power-source noise of the pixel power source and execute, on the first noise cancelling signal, a gain change and a polarity inversion based on a gain controlling signal to output a second noise cancelling signal; a DA converter configured to generate a reference signal as a ramp signal to output the generated reference signal, and convert a current of the second noise cancelling signal into a voltage to superpose the converted voltage on the reference signal; a comparator where the reference signal and the pixel signal are input to a main body part of a comparator via an input capacity connected to one of terminals of a differential pair, the comparator outputting an inversion signal having a timing according to the pixel signal and a gain setting; a counter that converts an inversion timing of the comparator into a digital value; and a gain controlling unit that outputs, when changing a gradient of the reference signal and the input capacity to execute a gain control on the comparator, the gain controlling signal based on a change amount in the input capacity.

According to the present disclosure, the noise-cancelling-signal generating circuit generates the first noise cancelling signal for cancelling a power-source noise of the pixel power source and executes, on the first noise cancelling signal, a gain change and a polarity inversion based on a gain controlling signal to output a second noise cancelling signal to the DA converter.

The DA converter is configured to cause a current output from a variable current source controlled by using a digital value to flow into an output resistance to generate a reference signal as a ramp signal, and output the generated reference signal to the comparator. The second noise cancelling signal is output to the DA converter as a current, and is caused to flow into the output resistance of the DA converter to be converted into a voltage, and is superposed on the ramp signal to be output to the comparator.

Reference signal and the pixel signal are input to a main body part of a comparator via an input capacity connected to one of terminals of a differential pair, the comparator outputs an inversion signal having a timing according to the pixel signal and a gain setting.

The counter converts an inversion timing of the comparator into a digital value, and outputs the digital value.

In parallel therewith, the gain controlling unit outputs, when changing a gradient of the reference signal and the input capacity to execute a gain control on the comparator, the gain controlling signal based on a change amount in the input capacity to the noise-cancelling-signal generating circuit.

DESCRIPTION OF EMBODIMENTS

Next, a preferable embodiment will be explained with reference to accompanying drawings.

Figure 1:
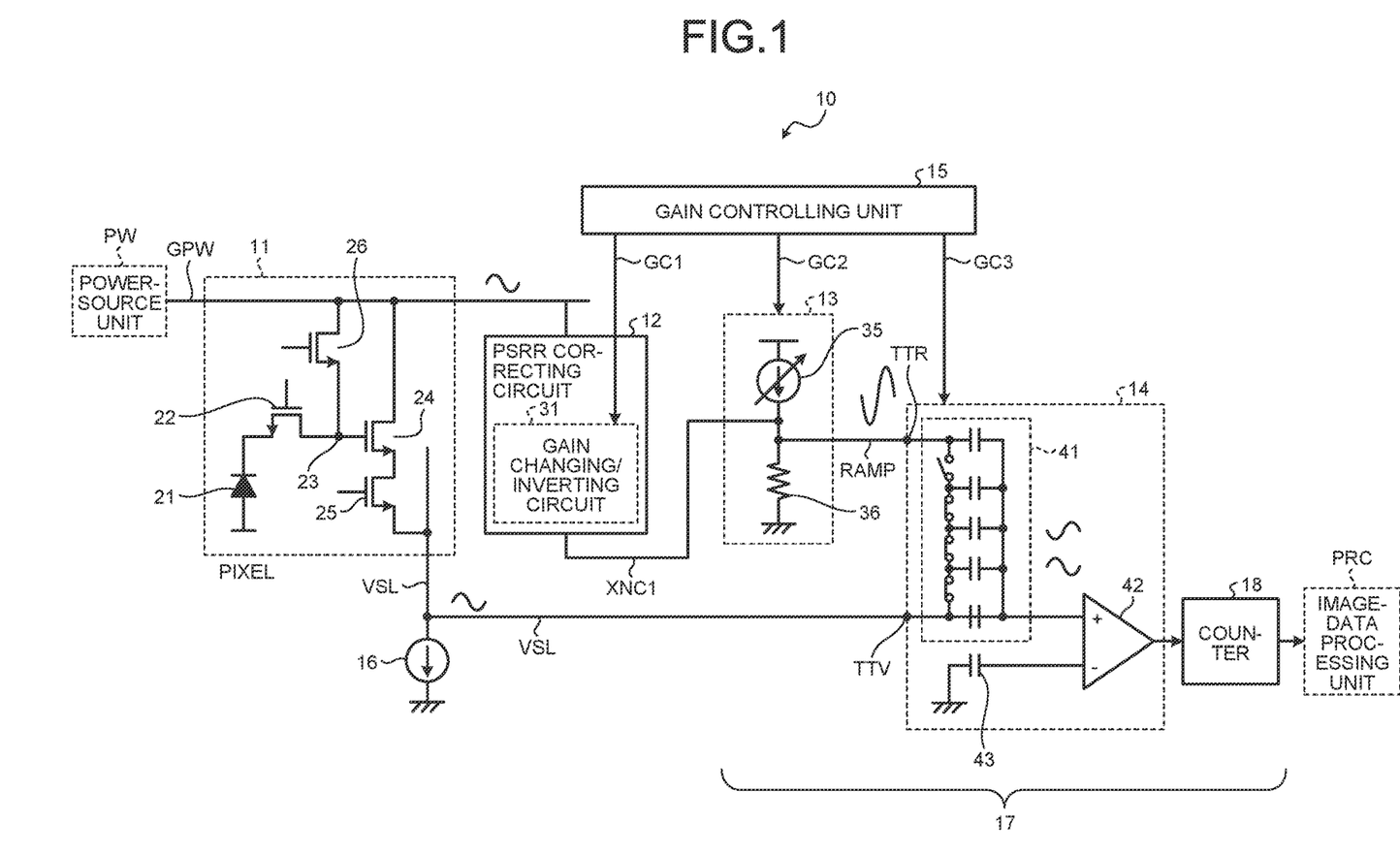
FIG. 1 is a diagram illustrating the outline of a configuration example of a solid-state image capturing element according to an embodiment.

FIG. 1 is a diagram illustrating the outline of a configuration example of a solid-state image capturing element according to the embodiment.

As the solid-state image capturing element according to the embodiment, a CCD image sensor, a CMOS image sensor, or the like is exemplified.

As illustrated in FIG. 1, a solid-state image capturing element 10 includes pixels 11, a PSRR correcting circuit 12, a DA converter 13, an ultra-low voltage (ULV) comparator 14, a gain controlling unit 15, and a load MOS transistor 16.

In the above-mentioned configuration, each of the pixels 11 is connected to a power-source unit PW, and the plurality of pixels 11 (for example, N-by-M matrix. N and M are integers equal to or greater than two.) is provided in the solid-state image capturing element 10 so as to constitute a pixel array unit. The pixels 11 photo-electrically convert light having made incident thereon so as to generate pixel signals according to light receiving amounts of the incident light.

For example, as illustrated in FIG. 1, each of the pixels 11 includes a photodiode 21, a transfer transistor 22, a floating diffusion region 23, an amplifying transistor 24, a selecting transistor 25, and a resetting transistor 26.

Next, a detailed configuration of the pixel 11 will be explained.

The number of the pixels 11 is corresponding to the number (in above-mentioned example, N×M) of pixels constituting a pixel array unit to be mentioned later that is provided in the image capturing element; however, for convenience of explanation, one pixel alone of them is illustrated in FIG. 1.

In the pixel 11, a cathode terminal of the photodiode 21 is connected to a source terminal of the transfer transistor 22 that is an N-channel MOS transistor, and a drain terminal of the transfer transistor 22 is connected to a gate terminal of the amplifying transistor 24 that is an N-channel MOS transistor. Moreover, a drain terminal of the resetting transistor 26 that is an N-channel MOS transistor is connected to a pixel power source GPW, and a source terminal of the resetting transistor 26 is connected to a gate terminal of the amplifying transistor 24.

In other words, the drain terminal of the transfer transistor 22 and the source terminal of the resetting transistor 26 are commonly connected to a gate terminal of the amplifying transistor 24.

Moreover, a drain terminal of the amplifying transistor 24 is connected to the pixel power source GPW, and a source terminal of the amplifying transistor 24 is connected to a drain terminal of the selecting transistor 25.

A source terminal of the selecting transistor 25 is connected to the load MOS transistor 16 that is a constant-current source via a corresponding vertical signal line VSL.

Herein, operations of the pixel 11 will be explained.

In capturing, light having made incident on the solid-state image capturing element 10 is received by the photodiode 21 to be photo-electrically converted, and electric charge obtained by the conversion is accumulated in the photodiode 21. Next, when voltage is applied to a gate of the transfer transistor 22 to be turned into a closed state (ON-state), the photodiode 21 and the floating diffusion region 23 are electrically connected to each other, and the electric charge of the photodiode 21 is transferred to the floating diffusion region 23 via the transfer transistor 22 so as to generate a signal voltage at a gate of the amplifying transistor 24.

In this state, when voltage is applied to a gate of the selecting transistor 25 connected to the vertical signal line VSL and the selecting transistor 25 is turned into a closed state (ON-state), a pixel signal VSL according to a gate voltage of the amplifying transistor 24 is supplied to the ULV comparator 14 via the amplifying transistor 24, the selecting transistor 25, and the vertical signal line VSL. Hereinafter, a reference symbol VSL indicating a vertical signal line is also used as a reference symbol indicating a pixel signal supplied from the vertical signal line to the ULV comparator 14.

Herein, the pixel signal VSL output from the pixel 11 is an analog signal having a voltage whose magnitude is according to a received light amount of the photodiode 21.

When voltage is applied to a gate of the resetting transistor 26 of the pixel 11 and the resetting transistor 26 is turned into a closed state (ON-state), voltage of the floating diffusion region 23 is returned to a power source voltage, and the pixel signal VSL is turned into a reset state.

The PSRR correcting circuit 12 includes a gain changing/inverting circuit 31 that executes a gain change under control of the gain controlling unit 15, and further executes amplification and polarity inversion on a noise cancelling signal.

Herein, a reason for providing the PSRR correcting circuit 12 will be explained.

In the solid-state image capturing element 10, a power-source noise from the pixel power source GPW propagates into the vertical signal line VSL via a not-illustrated parasitic capacity between nodes in the pixels, the amplifying transistor 24, and the selecting transistor 25.

Thus, the above-mentioned power-source noise is superposed on the pixel signal VSL output from the pixels 11 to be input to the ULV comparator 14, and thus an output inversion timing of the ULV comparator 14 deviates, there presents possibility that a precise pixel value is not obtained. Hence, the PSRR correcting circuit 12 is provided so as to cancel (correct) the power-source noise input to the ULV comparator 14, thereby leading to obtaining a correct pixel value.

Details of a configuration of the gain changing/inverting circuit 31 will be mentioned later.

The DA converter 13 includes a variable current source 35 controlled by using digital values and an output resistance 36 that is serially connected to the variable current source 35.

Output of the DA converter 13 in which the variable current source 35 is controlled by using digital values is a ramp signal whose signal level is changed with time, and functions as a reference signal for Analog-to-Digital-converting (A/D-converting) a pixel signal output from the pixel 11.

In the above-mentioned configuration, the DA converter 13, the ULV comparator 14, and a counter 18 function as a single-slope AD converter 17 that converts, from an analog signal to a digital signal, the pixel signal VSL that is output from the pixel 11.

Figure 2:
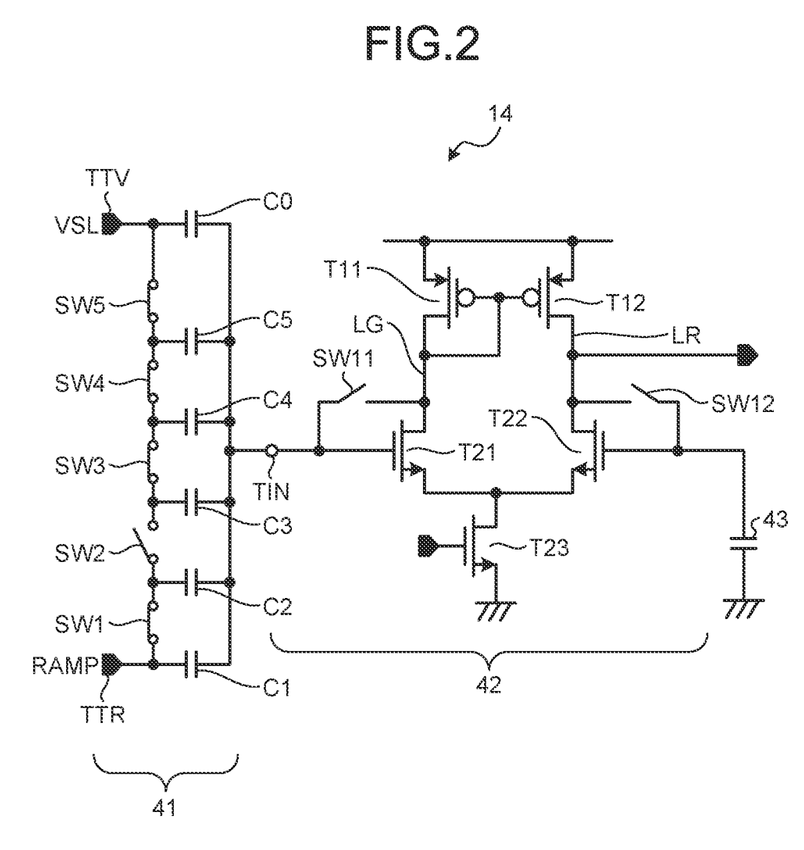
FIG. 2 is a diagram illustrating a circuit configuration example of an Ultra-Low Voltage (ULV) comparator.

Next, the ULV comparator 14 will be explained.

FIG. 2 is a diagram illustrating a circuit configuration example of the ULV comparator.

The ULV comparator 14 is roughly divided into an input capacity variable unit 41 including a pixel-signal inputting terminal TTV to which the pixel signal VSL output from the corresponding pixel 11 is input and a reference-signal inputting terminal TTR to which a ramp signal RAMP output from the DA converter 13 is input, a main body part of a comparator 42, and a reference-voltage holding capacitor 43.

On the basis of the pixel signal VSL input via the pixel-signal inputting terminal TTV and the ramp signal RAMP input via the reference-signal inputting terminal TTR, the ULV comparator 14 outputs an inversion signal having a timing based on a pixel signal level and a gain setting. The counter 18 converts the inversion timing into a digital value so as to execute AD conversion. In an image-data processing unit PRC in a latter part, various digital processes are executed on the pixel data AD-converted by the ULV comparator 14.

The input capacity variable unit 41 includes a capacitor C0 whose one end is connected to the pixel-signal inputting terminal TTV and whose other end is connected to a pixel-side input terminal TIN of the main body part of the comparator 42, a capacitor C1 whose one end is connected to the reference-signal inputting terminal TTR and whose other end is connected to the pixel-side input terminal TIN of the main body part of the comparator 42, a switch SW1 whose one end is connected to the reference-signal inputting terminal TTR, a switch SW2 that is serially connected to the switch SW1, a switch SW3 that is serially connected to the switch SW2, a switch SW4 that is serially connected to the switch SW3, a switch SW5 whose one end is connected to the switch SW4 and whose other end is connected to a connection point between the pixel-signal inputting terminal TTV and the capacitor C0, a capacitor C2 that is connected between the pixel-side input terminal TIN and a connection point between the switch SW1 and the switch SW2, a capacitor C3 that is connected between the pixel-side input terminal TIN and a connection point between the switch SW2 and the switch SW3, a capacitor C4 that is connected between the pixel-side input terminal TIN and a connection point between the switch SW3 and the switch SW4, and a capacitor C5 that is connected between the pixel-side input terminal TIN and a connection point between the switch SW4 and the switch SW5.

In the above-mentioned configuration, for example, the capacitors C1 to C5 have the same capacity, and assume that a capacity of the capacitor C0 corresponds to a capacity obtained by connecting in parallel a plurality of unit capacities respectively corresponding to the capacitors C1 to C5. The number of the capacitors C2 to C5 connected via switches, and the number of parallel connections of unit capacities in the capacitor C0 may be differ depending on the spec.

The main body part of the comparator 42 includes a current mirror circuit constituted of a pair of a transistor T11 and a transistor T12, which executes control such that current amount flowing through a pixel-side current line LG equals to that flowing through a reference-side current line LR, a pair of transistors T21 and T22 constituting a differential pair, a first reset switch SW11 that short-circuits between a drain terminal and a gate terminal of the transistor T21 to execute resetting, a second reset switch SW12 that short-circuits between a drain terminal and a gate terminal of the transistor T22 to execute resetting, and a current-source transistor T23 whose one end is commonly connected to a source terminal of the transistor T21 and a source terminal of the transistor T22 and whose source terminal is grounded. The main body part of the comparator 42 may employ a multi-stage configuration that includes one-or-more rear-stage amplifiers (not illustrated) in a latter part of the configuration of the differential amplifier illustrated in FIG. 2.

In executing a gain control, the gain controlling unit 15 outputs a gain controlling signal GC2 and a gain controlling signal GC3 so as to change a gradient of the ramp signal RAMP output from the DA converter 13 and an input capacity in the input capacity variable unit 41 of the ULV comparator 14. Moreover, the gain controlling unit 15 outputs a gain controlling signal GC1 and controls (changes), in conjunction with the change in input capacity in the input capacity variable unit 41, a gain of the PSRR correcting circuit for absorbing effects due to change in input capacity in order to reliably offset noise of the pixel power source.

Figure 3:
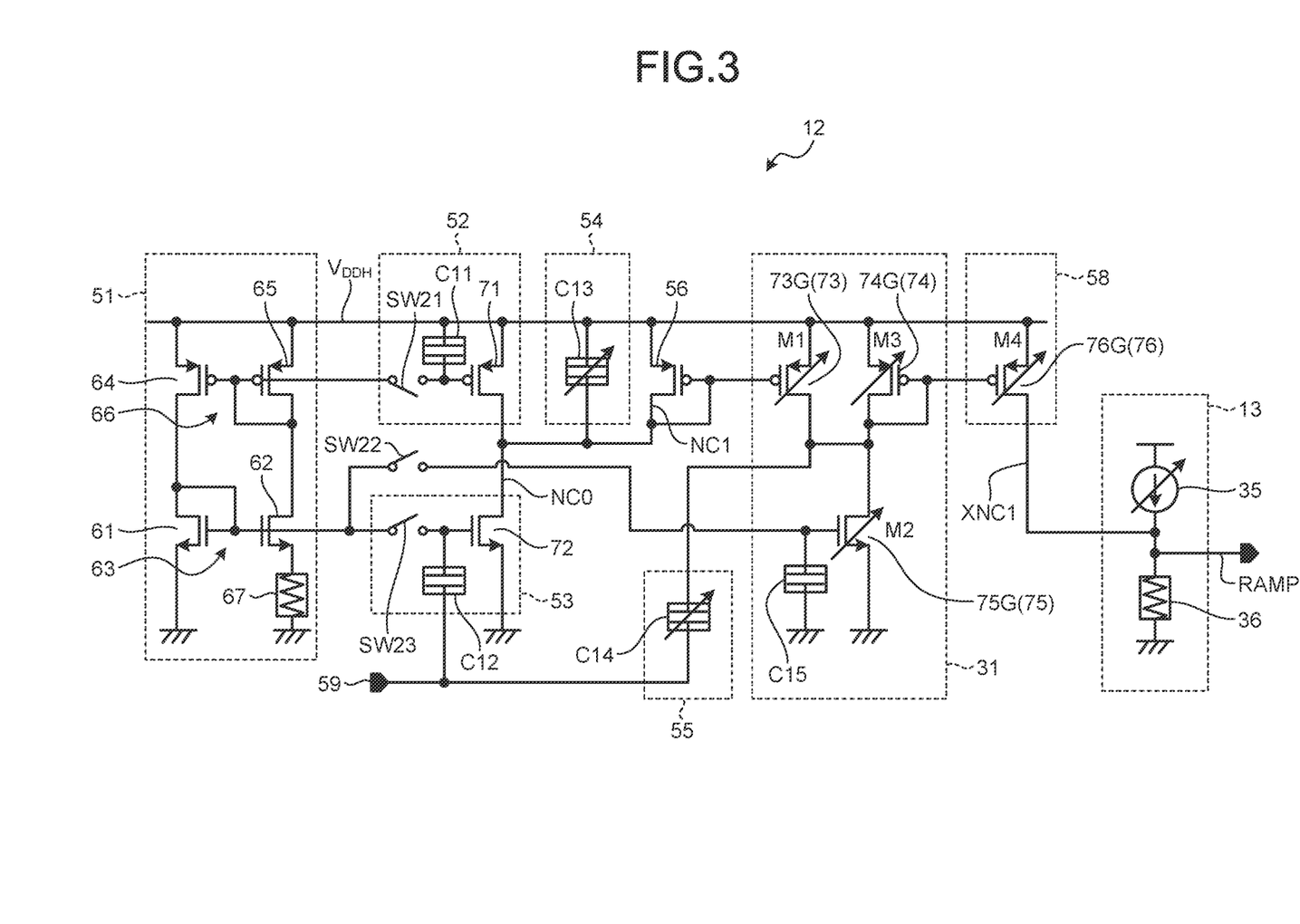
FIG. 3 is a diagram illustrating a configuration example of a Power Supply Rejection Ratio (PSRR) correcting circuit.

Next, details of a configuration of the PSRR correcting circuit 12 will be explained.

FIG. 3 is a diagram illustrating a configuration example of the PSRR correcting circuit.

In the present embodiment, the configuration illustrated in FIG. 3 is employed for the PSRR correcting circuit, so that it is possible to realize low power consumption and accurate noise correction.

As illustrated in FIG. 3, the PSRR correcting circuit 12 includes a conductance fixed bias unit 51, a bias unit 52, an input sense unit 53, a phase-delay adjusting unit 54, a phase-lead adjusting unit 55, a transistor 56, the gain changing/inverting circuit 31, a gain adjusting unit 58, and a pixel-power-source inputting terminal (noise monitoring terminal) 59. A plurality of configurations may be employed for a PSRR correcting circuit having the same characteristics, and thus a specific circuit before/after the gain changing/inverting circuit 31 may have a configuration different from that illustrated in FIG. 3.

The conductance fixed bias unit 51 includes a first current mirror circuit 63 that includes an N-channel MOS transistor 61 and an N-channel MOS transistor 62, a second current mirror circuit 66 that includes a P-channel MOS transistor 64 and a P-channel MOS transistor 65, and a pull-up resistor 67 so as to apply a fixed bias voltage to the bias unit 52, the input sense unit 53, and the gain changing/inverting circuit 31.

In the above-mentioned configuration, a current amount of the N-channel MOS transistor 62 is m times as large as that of the N-channel MOS transistor 61. Gate terminals of the N-channel MOS transistor 61 and the N-channel MOS transistor 62 are connected to each other.

A source terminal of the N-channel MOS transistor 61 is grounded, and a drain terminal of the N-channel MOS transistor 61 is connected to a gate terminal of the N-channel MOS transistor 61. On the other hand, a source terminal of the N-channel MOS transistor 62 is grounded via the pull-up resistor 67.

Sizes of the P-channel MOS transistor 64 and the P-channel MOS transistor 65 are the same to each other. Moreover, a gate terminal of the P-channel MOS transistor 65 is connected to a gate terminal of the P-channel MOS transistor 64.

A source terminal of the P-channel MOS transistor 64 is connected to a power source $V_{DDH}$, and a drain terminal of the P-channel MOS transistor 64 is connected to a drain terminal of the N-channel MOS transistor 61. In this case, the power source $V_{DDH}$ may be a pixel power source, or may be a power source other than the pixel power source.

A source terminal of the P-channel MOS transistor 65 is connected to the power source $V_{DDH}$, and a drain terminal of the P-channel MOS transistor 65 is connected to a drain terminal of the N-channel MOS transistor 62. The drain terminal of the P-channel MOS transistor 65 is further connected to a gate terminal of the P-channel MOS transistor 65.

In the conductance fixed bias unit 51 having the above-mentioned configuration, a conductance of the N-channel MOS transistor 61 is constant, and the conductance is a constant value depending on m that is a ratio of the number of parallel connections between the N-channel MOS transistor 61 and the N-channel MOS transistor 62, and a resistance value of the pull-up resistor 67.

The bias unit 52 includes a P-channel MOS transistor 71, a switch SW21, and a capacitor (capacity element) C11.

A drain terminal of the P-channel MOS transistor 71 is connected to the power source $V_{DDH}$, and a gate terminal of the P-channel MOS transistor 71 is connected to the power source $V_{DDH}$ via a capacitor C11.

Moreover, the gate terminal of the P-channel MOS transistor 71 is connected, via the switch SW21, to gate terminals of the P-channel MOS transistors 64 and 65 of the conductance fixed bias unit 51.

In the above-mentioned bias unit 52, the P-channel MOS transistor 71 functions as a current source, and current always flows from a drain terminal of the P-channel MOS transistor 71 to a common connection point of a drain terminal of an N-channel MOS transistor 72 and the P-channel MOS transistor 56 such that a conductance of the N-channel MOS transistor 72 of the input sense unit 53 is a constant value.

The input sense unit 53 includes the N-channel MOS transistor 72, a switch SW23, and a capacitor (capacity element) C12.

The source terminal of the N-channel MOS transistor 71 is grounded, and a gate terminal of the N-channel MOS transistor 71 is connected to a pixel-power-source inputting terminal via the capacitor C12.

Moreover, the gate terminal of the N-channel MOS transistor 71 is connected, via the switch SW23 used in sample holding, to gate terminals of the N-channel MOS transistors 61 and 62 in the conductance fixed bias unit 51.

A drain terminal of the N-channel MOS transistor 72 is connected to the bias unit 52 and the phase-delay adjusting unit 54. The drain terminal of the N-channel MOS transistor 72 is connected to a gate terminal of the P-channel MOS transistor 56.

In the input sense unit 53 having the above-mentioned configuration, for example, the switch SW23 is changed into a closed state (ON-state) during a time interval in which a noise is not cancelled so as not to correct a power-source noise, and an operation point of the gate terminal of the N-channel MOS transistor 72 is fixed. In other words, in such a state, current flows into the N-channel MOS transistor 72, which is according to current flowing through the N-channel MOS transistor 61 of the conductance fixed bias unit 51.

Moreover, during a time interval of noise cancelling, in other words, a time interval in which a noise cancelling signal XNC1 is superposed on the ramp signal RAMP that is a reference signal for correcting a power-source noise, the switch SW23 is in an open state (OFF-state).

As a result, an AC component of power-source noise detected at the pixel-power-source inputting terminal 59 is extracted by the capacitor C12 that functions as a high-pass filter, so as to be input to a gate terminal of the N-channel MOS transistor 72.

Current, including an AC component according to an AC (alternate current) component of a pixel-power-source noise included in the pixel power source and a DC component depending on the N-channel MOS transistor 61, is input to the N-channel MOS transistor 72 as a noise cancelling signal NC0, and power-source noise as a voltage signal is converted to the noise cancelling signal NC0 that is a current signal.

As described above, a conductance of the N-channel MOS transistor 61 is always constant (fixed), and thus a conductance of the N-channel MOS transistor 72 is a constant value.

Therefore, fluctuation in a gain $\Delta Id/\Delta Vin$ of voltage-current conversion is able to be reduced, and thus there presents no need for providing a pull-up resistor between the N-channel MOS transistor 72 and the ground, a gain (=$\Delta Id/\Delta Vin$) in voltage-current conversion is able to be increased, so that it is possible to realize low power consumption and low noise of the input sense unit 53.

As described above, current always flows from a drain terminal of the P-channel MOS transistor 71 to a common connection point of a drain terminal of the N-channel MOS transistor 72 and the P-channel MOS transistor 56 such that a conductance of the N-channel MOS transistor 72 of the input sense unit 53 is a constant value.

Therefore, current that is flowing on a side of the P-channel MOS transistor 56 is obtained by subtracting current flowing from the P-channel MOS transistor 71 of the bias unit 52 to the common connection point of the drain terminal of the N-channel MOS transistor 72 and the P-channel MOS transistor 56 from the noise cancelling signal NC0 flowing through the N-channel MOS transistor 72 of the input sense unit 53.

In other words, current flowing on a side of the P-channel MOS transistor 56 is a noise cancelling signal NC1 (corresponding to first noise cancelling signal) obtained by removing a part of a DC component from the noise cancelling signal NC0 by using the bias unit 52.

Moreover, in the bias unit 52, during a time interval in which noise cancelling is not executed, the switch SW21 is in a closed state (ON-state), and during a time interval in which noise cancelling is executed, the switch SW21 is in an open state (OFF-state).

When the switch SW21 is turned into an open state (OFF-state) during a time interval in which noise cancelling is executed as described above, output noise of the conductance fixed bias unit 51 is output, via the P-channel MOS transistor 71, to a common connection point of a drain terminal of the N-channel MOS transistor 72 and the P-channel MOS transistor 56, so that it is possible to prevent the output noise from being superposed on the noise cancelling signal NC1. Moreover, there presents no need for providing the switch SW21 in some cases.

The phase-delay adjusting unit 54 includes a variable-capacitance capacitor C13 between the power source $V_{DDH}$ and a common connection point of a drain terminal of the N-channel MOS transistor 72 and the P-channel MOS transistor 56.

The phase-delay adjusting unit 54 adjusts phase delay of a high-frequency component in a noise cancelling signal that is a current flowing from the P-channel MOS transistor 56 to the common connection point of the drain terminal of the N-channel MOS transistor 72 and the P-channel MOS transistor 56.

In other words, the variable-capacitance capacitor C13 of the phase-delay adjusting unit 54 functions as a low-pass filter and attenuates an AC component (gain) of a noise cancelling signal so as to execute phase adjustment, namely, to adjust a phase delay. In this case, a cutoff frequency of the low-pass filter is depending on a capacity of the variable-capacitance capacitor C13 and a resistance component of the P-channel MOS transistor 56.

The phase-lead adjusting unit 55 includes a variable-capacitance capacitor C14 that is connected between the pixel-power-source inputting terminal 59 and the gain changing/inverting circuit 31.

The phase-lead adjusting unit 55 adjusts a phase lead in a high-frequency region of the noise cancelling signal NC1 that is a current flowing from a common connection point between a drain terminal of the N-channel MOS transistor 72 and the P-channel MOS transistor 56 to the gain changing/inverting circuit 31.

In the phase-lead adjusting unit 55, the gain changing/inverting circuit 31 and the pixel power source are connected via the variable-capacitance capacitor C14 so as to cause a high-pass component to propagate into the gain changing/inverting circuit 31.

In other words, the variable-capacitance capacitor C14 of the phase-lead adjusting unit 55 functions as a high-pass filter, and superposes a high-frequency component of the pixel-power-source noise on the gain changing/inverting circuit 31 so as to execute phase adjustment, namely, to adjust a phase lead. In this case, a cutoff frequency as a high-pass filter is depending on a capacity of the variable-capacitance capacitor C14 and an apparent resistance value of the gain changing/inverting circuit 31.

The gain changing/inverting circuit 31 includes a P-channel MOS-transistor group 73G constituted of a plurality of P-channel MOS transistors 73 connected in parallel whose gate terminals are commonly connected to a gate terminal of the P-channel MOS transistor 56, whose source terminals are commonly connected to a power source $V_{DD}$, and whose drain terminals are commonly connected to the variable-capacitance capacitor C14 of the phase-lead adjusting unit 55.

The gain changing/inverting circuit 31 includes a P-channel MOS-transistor group 74G constituted of a plurality of P-channel MOS transistors 74 connected in parallel whose source terminals are commonly connected to the power source $V_{DD}$, whose drain terminals are commonly connected to the commonly-connected drain terminals of the P-channel MOS-transistor group 73G, and whose gate terminals are commonly connected to the drain terminals via a connection-number of changing switches (not-illustrated).

The gain changing/inverting circuit 31 includes an N-channel MOS-transistor group 75G, which functions as a current source, constituted of a plurality of N-channel MOS transistors 75 connected in parallel, whose drain terminals are connected to common connection points between the commonly-connected drain terminals of the P-channel MOS-transistor group 73G and the commonly-connected drain terminals of the P-channel MOS-transistor group 74G, whose source terminals are commonly connected to the ground, and whose commonly-connected gate terminals are connected to a gate terminal of the N-channel MOS transistor 61 of the conductance fixed bias unit 51 via a switch SW22, and a capacitor C15 whose one end is connected to the commonly-connected gate terminals of the N-channel MOS-transistor group 75G, and whose other end is grounded.

In the above-mentioned configuration, the number of the P-channel MOS transistors 73 to be actually operated (number of parallel connections of P-channel MOS transistors 73) among the plurality of P-channel MOS transistors 73 connected in parallel and constituting the P-channel MOS-transistor group 73G, the number of the P-channel MOS transistors 74 to be actually operated (number of parallel connections of P-channel MOS transistors 74) among the plurality of P-channel MOS transistors 74 connected in parallel and constituting the P-channel MOS-transistor group 74G, and the number of the N-channel MOS transistors 75 to be actually operated (number of parallel connections of N-channel MOS transistors 75) among the plurality of N-channel MOS transistors 75 connected in parallel and constituting the N-channel MOS-transistor group 75G are able to be changed in conjunction with change in input capacity of a ULV comparator to be mentioned later, so that it is possible to effectively execute gain change of the PSRR correcting circuit 12.

Details of the gain change of the gain changing/inverting circuit 31 will be mentioned later.

Note that a configuration of the gain changing/inverting circuit 31 is merely one example, and another circuit having a polarity inverting function of waveform and a gain changing function may be similarly applied.

The gain adjusting unit 58 includes a P-channel MOS-transistor group 76G constituted of P-channel MOS transistors 76 connected in parallel, in which gate terminals of the plurality of P-channel MOS transistors 76 connected in parallel are commonly connected, via a connection-number of changing switches (not illustrated), to commonly-connected gate terminals of the plurality of P-channel MOS transistors connected in parallel and constituting a P-channel MOS-transistor group 74, whose source terminals are commonly connected to the power source $V_{DD}$, and whose drain terminals are commonly connected to a connection point between the variable current source 35 and the output resistance 36 in the DA converter 13.

Herein, the gain adjusting unit 58 adjusts the number of parallel connections of the P-channel MOS transistors to be actually driven (changes number of outputs of multi-output current mirror formed by cooperation with P-channel MOS-transistor group 74) such that a noise signal and a noise cancelling signal are appropriately offset to each other in the ULV comparator 14 so as to execute a fine adjustment of gain in accordance with amplitude of a power-source noise signal.

Herein, operations of the gain changing/inverting circuit 31 will be explained.

The P-channel MOS-transistor group 73G in the gain changing/inverting circuit 31 functions as a multi-output current mirror circuit in cooperation with the P-channel MOS transistor 56, and thus current that is proportional to current flowing through the P-channel MOS transistor 56 by the noise cancelling signal NC1 (current having the same polarity whose magnitude ratio is corresponding to size ratio of transistor) flows between a source terminal and a drain terminal of each of the P-channel MOS transistors 73 constituting the P-channel MOS-transistor group 73G.

In this case, the sum of current flowing between source terminals and drain terminals of the plurality of P-channel MOS transistors 73 constituting the P-channel MOS-transistor group 73G which are actually operating, and current flowing between source terminals and drain terminals of the plurality of P-channel MOS transistors 74 constituting the P-channel MOS-transistor group 74G which are actually operating is equal to current flowing between drain terminals and source terminals of the plurality of N-channel MOS transistors 75 constituting the N-channel MOS-transistor group 75G that functions as a current source, which are actually operating.

Therefore, current flowing through the P-channel MOS-transistor group 74G is equal to current obtained by subtracting current flowing the P-channel MOS-transistor group 73G from current flowing through the N-channel MOS-transistor group 75G.

In other words, current flowing through the P-channel MOS-transistor group 74G has a reverse polarity with respect to current corresponding to the noise cancelling signal NC1 flowing through the P-channel MOS-transistor group 73G.

A noise cancelling signal whose gain is changed and whose polarity is inverted (hereinafter, may be referred to as reverse-polarity noise cancelling signal XNC1, and corresponding to second noise cancelling signal) is supplied to the DA converter 13 as a final noise cancelling signal.

Next, operations of the whole solid-state image capturing element will be explained.

In executing a gain control, the gain controlling unit 15 of the solid-state image capturing element 10 changes both of a slope gradient of the ramp signal RAMP as a reference signal output from a DA converter and an input capacity of the input capacity variable unit 41 of the ULV comparator 14.

Incidentally, in the ULV comparator 14, input capacities of the pixel signal VSL and the ramp signal RAMP are arranged on the same side while forming a differential pair, because the input capacity is arranged on a side of the ramp signal RAMP, an attenuation amount from the pixel signal VSL to the differential pair becomes larger, due to a capacity division, than that of the case of conventional comparators. As a result, there presents a problem that noise of transistors effectively increases in terms of the pixel signal VSL.

Thus, an input capacity on a side of the ramp signal RAMP is reduced so as to increase amplitude of the ramp signal RAMP, so that it is possible to reduce an attenuation amount to the differential pair of the pixel signal VSL and further to reduce worsening of noise while keeping output result as the single-slope AD converter 17 (=DA converter 13+ULV comparator 14+counter 18).

However, when a gain of the single-slope AD converter 17 is low, amplitude of the ramp signal RAMP is originally large, and thus an input capacity on a side of the ramp signal RAMP is not reduced.

Figure 5:
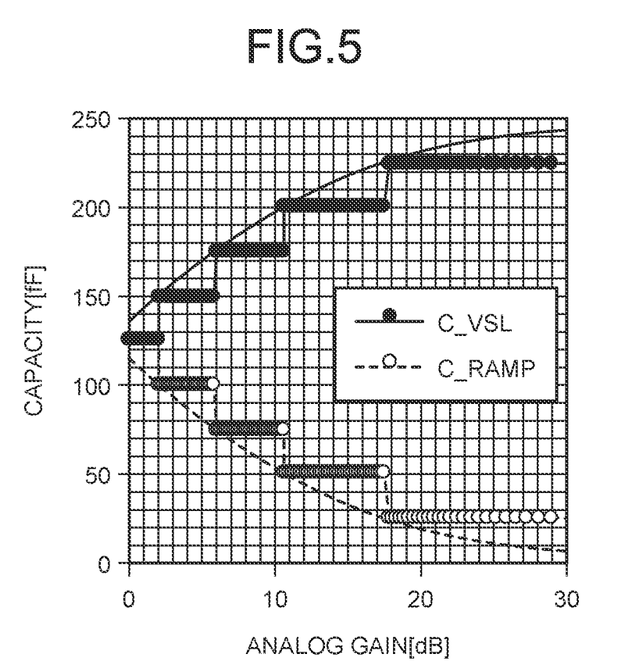
FIG. 5 is a diagram illustrating relation between a gain of the single-slope AD converter and input capacities on a ramp signal side and a pixel signal side.

As illustrated in FIG. 5, when a gain of the single-slope AD converter 17 is low (see left part of FIG. 5), in the gain controlling unit 15, an input capacity C_RAMP on a side of the ramp signal RAMP is increased, and an input capacity C_VSL on a side of the pixel signal VSL is reduced.

On the other hand, when a gain of the single-slope AD converter 17 is high (see right part of FIG. 5), in the gain controlling unit 15, an input capacity on a side of the ramp signal RAMP is reduced, and an input capacity on a side of the pixel signal VSL is increased.

As a result, as a gain is more reduced from a state of a high gain, the input capacity C_RAMP on a side of the ramp signal RAMP is more increased step by step, and the input capacity C_VSL on a side of the pixel signal VSL is more reduced step by step.

Figure 4:
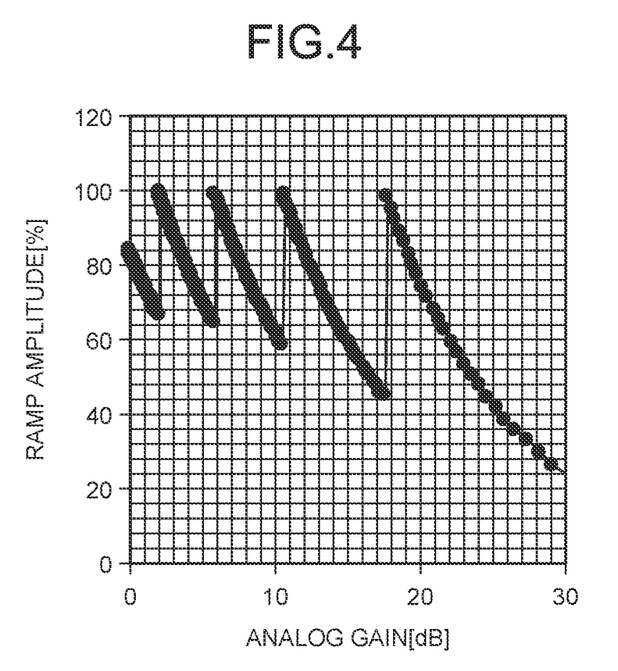
FIG. 4 is a diagram illustrating relation between a gain of a single-slope AD converter and an amplitude of a ramp signal.

FIG. 4 is a diagram illustrating relation between a gain of a single-slope AD converter and an amplitude of a ramp signal.

FIG. 5 is a diagram illustrating relation between a gain of the single-slope AD converter and input capacities on a ramp signal side and a pixel signal side.

Note that when a gain of the single-slope AD converter 17 is extremely low, although a noise cancelling efficiency may be reduced, noise is able to be reduced by executing band adjustment and the like.

As described above, the gain controlling unit 15 sets control signals of the units in accordance with gain setting of the single-slope AD converter 17, and step by step changes an input capacity and also changes amplitude of the ramp signal RAMP in accordance therewith so as to minimize noise worsening.

The gain controlling unit 15 simultaneously controls the gain changing/inverting circuit 31 of the PSRR correcting circuit 12 so as to change a gain of the PSRR correcting circuit in accordance of change in a capacity (input capacity) of the input capacity variable unit 41 in the ULV comparator 14.

More specifically, the gain controlling unit 15 controls the gain changing/inverting circuit 31 so as to control the number of the P-channel MOS transistors 73 to be connected in parallel and to be actually driven among the P-channel MOS transistors 73 constituting the P-channel MOS-transistor group 73G in the gain changing/inverting circuit 31.

Similarly, the number of the P-channel MOS transistors 74 to be connected in parallel and actually driven among the P-channel MOS transistors 74 constituting the P-channel MOS-transistor group 74G is controlled, and the number of the N-channel MOS transistors 75 to be connected in parallel and actually driven among the N-channel MOS transistors 75 constituting the N-channel MOS-transistor group 75G is controlled.

In this case, the sum of current flowing between source terminals and drain terminals of the plurality of P-channel MOS transistors 73 constituting the P-channel MOS-transistor group 73G which are actually operating, and current flowing between source terminals and drain terminals of the plurality of P-channel MOS transistors 74 constituting the P-channel MOS-transistor group 74G which are actually operating is equal to current flowing between drain terminals and source terminals of the plurality of N-channel MOS transistors 75 constituting the N-channel MOS-transistor group 75G that functions as a current source, which are actually operating.

During AD conversion of the pixel signal VSL, the PSRR correcting circuit 12 monitors occurrence of a power-source noise in the pixel power source GPW, and generates, on the basis of the power-source noise generated by the pixel power source GPW, the noise cancelling signal XNC1 for cancelling (correcting) the power-source noise to output the generated noise cancelling signal XNC1 to the DA converter 13.

On the other hand, the DA converter 13 generates the ramp signal RAMP that is a reference signal and whose waveform (voltage value) changes in a slope shape over time, and the generated signal is output to the ULV comparator 14.

Therefore, the ramp signal RAMP output from the DA converter 13 includes the noise cancelling signal XNC1 having a reverse polarity with respect to a noise signal of the pixel power source.

In other words, the PSRR correcting circuit 12 inputs, via the DA converter 13, the generated noise cancelling signal XNC1 to the ULV comparator 14 so as to cause the ULV comparator 14 to cancel a power-source noise. Thus, the ramp signal RAMP, which is a reference signal on which the noise cancelling signal XNC1 is superposed, is input to the ULV comparator 14, and thus the noise cancelling signal XNC1 cancels, during comparison between the ramp signal RAMP and the pixel signal VSL transmitted from the pixel 11, a power-source noise of the pixel power source GPW which is superposed on the pixel signal VSL.

As a result, the single-slope AD converter 17 effectively outputs, as a digital pixel signal, A/D conversion result of the pixel signal VSL (after offsetting noise of pixel power source).

Therefore, in the solid-state image capturing element 10, even when a power-source noise from the pixel power source propagates into the vertical signal line VSL via a parasitic capacity between nodes in pixels, the amplifying transistor 24, and the selecting transistor 25, and thus the above-mentioned power-source noise is superposed on a pixel signal output from the pixel 11 to be input to the ULV comparator 14; it is possible to obtain a pixel signal having a precise pixel value without deviation in an inversion timing of output from the ULV comparator 14.

According to the solid-state image capturing element 10 as described above, a power-source noise is able to be cancelled with high accuracy by a simpler configuration, and thus it is possible to obtain a higher-quality image. Moreover, according to the solid-state image capturing element 10, it is possible to realize low power consumption.

Configuration Example of Image Capturing Element

Figure 6:
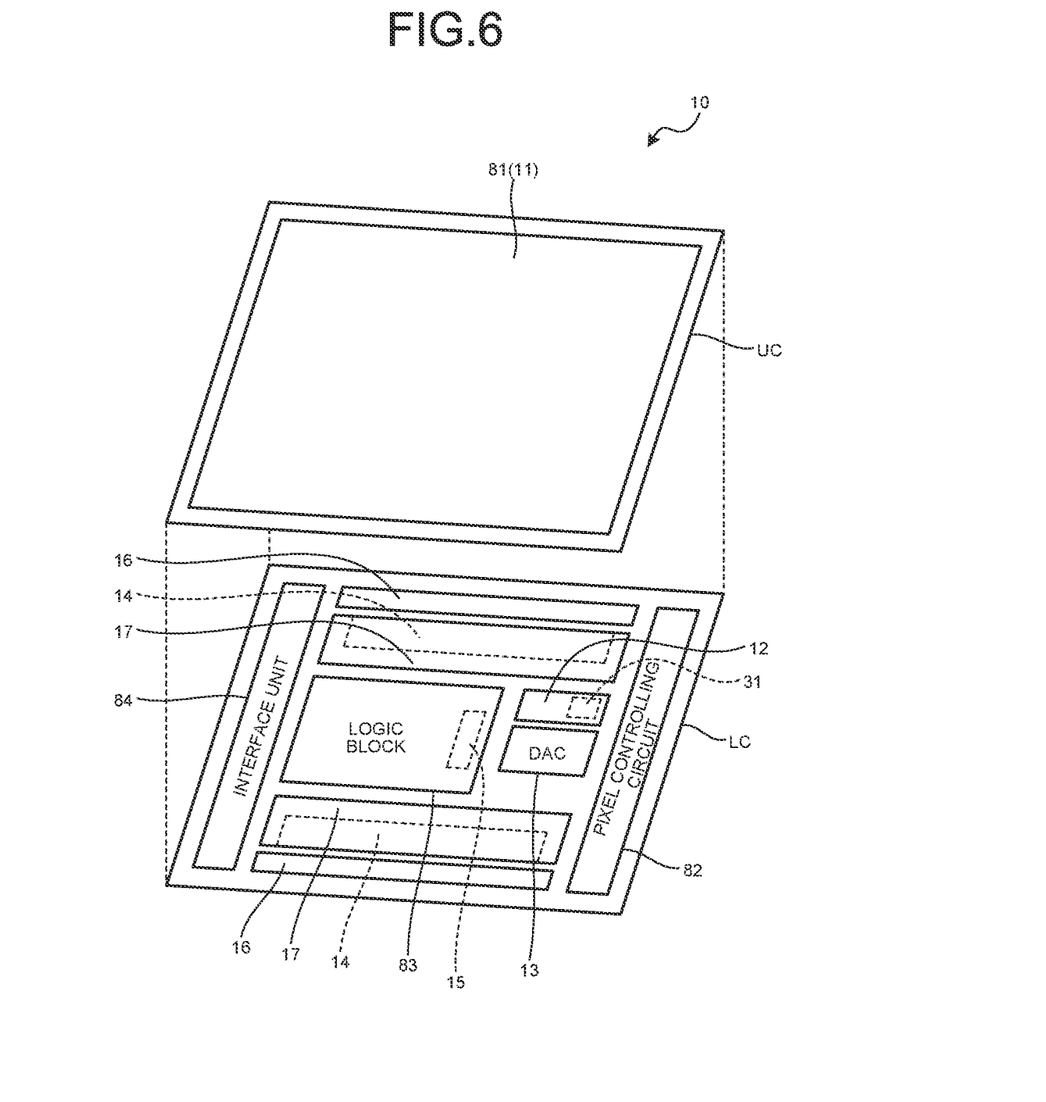
FIG. 6 is a diagram illustrating one example of a floor plan of the image capturing element.

FIG. 6 is a diagram illustrating one example of a floor plan of the image capturing element.

Various floor plans of the image capturing element are considered, and a pixel array unit 81 to which the plurality of pixels 11 is provided is arranged on an upper tip UC.

In addition to the above-mentioned PSRR correcting circuit 12, the DA converter 13, the ULV comparator 14, the gain controlling unit 15, and the load MOS transistor 16, a lower tip LC includes a pixel controlling circuit 82 that executes control for reading out from the pixel array unit 81, a logic block 83 that includes the gain controlling unit 15 and an MPU so as to execute various control and image processing of whole of the solid-state image capturing element 10, and an interface unit 84 that executes various interface operations.

In the above-mentioned configuration, there presents need for causing current corresponding to the noise cancelling signal XNC1 to flow into the output resistance 36 constituting the DA converter 13, and thus it is preferable that the PSRR correcting circuit 12 is arranged to be adjacent to the DA converter 13 in order to reduce effects of noise contamination caused by increase in a wire length, and change in frequency characteristics.

The plurality of ULV comparators 14 constituting the single-slope AD converters 17 are respectively arranged in upper and lower parts of the lower tip LC illustrated in FIG. 6, the pixel signal VSL is input to the ULV comparators 14 from the pixel 11 constituting the pixel array unit 81 of the upper tip UC, and thus it is preferable that the DA converter 13 having to supply the ramp signal RAMP to the plurality of ULV comparators 14 is arranged in the center part of the lower tip.

Configuration Example of Image Capturing Device

Moreover, the present technology may be generally employed for an electronic device in which an image capturing element is used for its photoelectric converting unit, such as an image capturing device including a digital still camera or a video camera, a portable terminal device having a capturing function, and a copying machine in which an image capturing element is used for its image reading unit.

Figure 7:
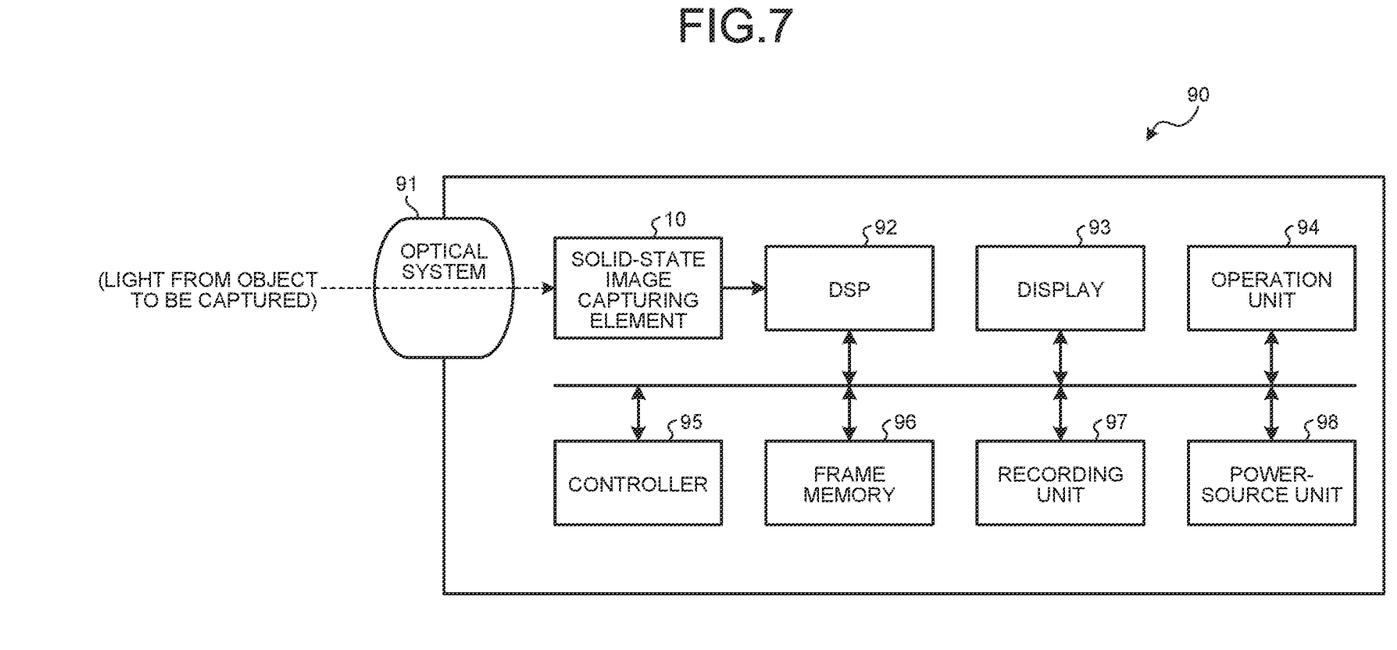
FIG. 7 is a diagram illustrating a configuration example of an image capturing device as another electronic device.

FIG. 7 is a diagram illustrating a configuration example of an image capturing device as another electronic device.

An image capturing device 90 includes an optical system 91 including a lens group and the like, the solid-state image capturing element 10, a Digital Signal Processor (DSP) 92 as a signal processing circuit which processes captured data, a display 93 constituted of a liquid crystal display, an organic electroluminescence (EL) display, or the like so as to display captured images and various kinds of information, an operation unit 94 with which a user performs various operations such as image capturing instruction and data setting, a controller 95 that executes control on whole of the image capturing device 90, a frame memory 96 that stores therein image data, a recording unit 97 that executes recording of captured data on a recording medium such as a hard disk (not illustrated), a memory card, and the like, and a power-source unit 98 that supplies electric power to whole of the image capturing device 90.

In the above-mentioned configuration, the DSP 92, the display 93, the operation unit 94, the controller 95, the frame memory 96, the recording unit 97, and the power-source unit 98 are connected to each other via a bus line.

According to the above-mentioned configuration, the above-mentioned solid-state image capturing element 10 is employed for an image capturing element, and thus it is possible to capture, for a long time with low power consumption, images that are clear with little noise and whose image quality are high.

As actual modes of the image capturing device 90, there may be exemplified a video camera, a digital still camera, and a camera module for a mobile terminal device such as a smartphone.

Figure 8:
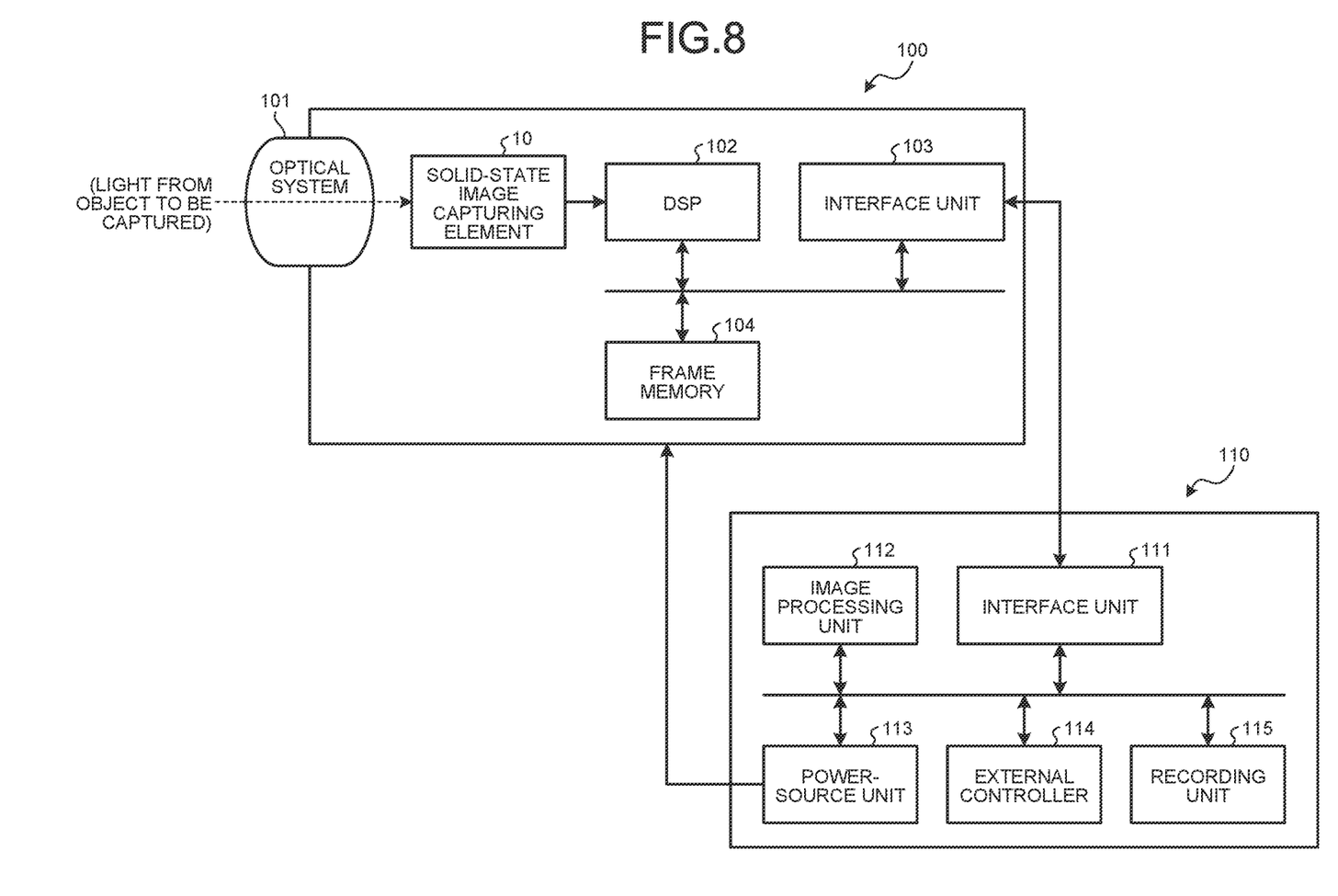
FIG. 8 is a diagram illustrating a configuration example of an image capturing device as still another electronic device.

FIG. 8 is a diagram illustrating a configuration example of an image capturing device as still another electronic device.

An image capturing device 100 includes an optical system 101 including a lens group and the like, the solid-state image capturing element 10, a DSP 102 as a signal processing circuit for processing captured data, an interface unit 103 that executes interface operations with an external device 110, and a frame memory 104 that stores therein image data.

The image capturing device 100 according to the present mode is configured to execute capturing under control of the external device 110 by power source supplied from the external device 110, for example, and may be employed for a camera module etc. that receives, under control of an on-vehicle ECU as the external device 110 and the like, power-source supplied from a vehicle side to capture monitoring images of the periphery of a vehicle.

In this case, the external device 110 includes an interface unit 111 that executes interface operations with the image capturing device 100, an image processing unit 112 that executes image processing on captured data that is acquired via the interface unit 111 so as to execute image processing for obtaining desired image data (for example, vicinity obstacle image, sign recognition image, and the like), a power-source unit 113 that supplies operation power source to the image capturing device 100 and the above-mentioned external device 110, an external controller 114 that controls the image capturing device 100 via an interface unit 11, and a recording unit 115 that executes recording of captured data on a recording medium such as a hard disk (not illustrated), a memory card, and the like.

As application examples of the above-mentioned image capturing device 100, there are exemplified an on-vehicle sensor that is arranged on a peripheral face (front surface, side surface, back surface) of an automobile or arranged in an interior of an automobile for ensuring safe driving such as automatic stopping and for recognizing states of a driver so as to capture the periphery or the interior of a vehicle, a monitoring camera for remotely monitoring traveling vehicles and roads, and a distance measuring device, and the like.

Note that there may be used as an image capturing device for detecting a position, operation (gesture), and the like of a user and for executing control on the external device 110 including household electrical appliances (air conditioner, refrigerator, microwave oven, and the like).

Moreover, there may be used for human recognition, photographing skin, and the like.

The above-mentioned description is in a case in capturing images corresponding to visible light; however, there may be used as an image capturing device for infrared ray, ultraviolet ray, X-ray, and the like.

The effects described in the present specification are merely explanations or exemplifications, and are not limiting. In other words, the techniques according to the present disclosure may exert other effects.

Configurations below also belong to the technical scope of the present disclosure.

(1)
1. A solid-state image capturing element including:
   a pixel that outputs a pixel signal;
   a noise-cancelling-signal generating circuit connected to a pixel power source that supplies electric power to the pixel, the noise-cancelling-signal generating circuit configured to:
      generate a first noise cancelling signal for cancelling a power-source noise of the pixel power source; and
      execute, on the first noise cancelling signal, a gain change and a polarity inversion based on a gain controlling signal to output a second noise cancelling signal;
   a Digital-to Analog (DA) converter configured to:
      generate a reference signal as a ramp signal to output the generated reference signal; and
      convert a current of the second noise cancelling signal into a voltage to superpose the converted voltage on the reference signal;
   a comparator where the reference signal and the pixel signal are input to a main body part of the comparator via an input capacity connected to one of terminals of a differential pair, the comparator outputting an inversion signal having a timing according to the pixel signal and a gain setting;
   a counter that converts an inversion timing of the comparator into a digital value; and
   a gain controlling unit that outputs, when changing a gradient of the reference signal and the input capacity to execute a gain control on the comparator, the gain controlling signal based on a change amount in the input capacity.

(2)
The solid-state image capturing element according to (1), wherein
   the comparator includes an input capacity changing unit including:
      a first capacitor that is connected between an input terminal and one of the terminals of the differential pair;
      a plurality of second capacitors whose one ends are connected to the one terminal of the differential pair; and
      a plurality of switches that connects in parallel the second capacitors and the first capacitor to each other.

(3)
The solid-state image capturing element according to (1) or (2), wherein
   the noise-cancelling-signal generating circuit includes:
      a pixel-power-source inputting unit to which the pixel power source is connected;
      a first noise-cancelling-signal generating unit that converts a pixel-power-source voltage input via the pixel-power-source inputting unit into a current to generate the first noise cancelling signal; and
      a gain changing/inverting circuit that executes a gain change and a polarity inversion on the first noise cancelling signal based on the gain controlling signal.

(4)
The solid-state image capturing element according to (3), wherein
   the gain changing/inverting circuit includes:
      a first transistor group constituted of a plurality of transistors connected in parallel and capable of outputting a current amount proportional to a current amount of the first noise cancelling signal;
      a second transistor group constituted of a plurality of transistors connected in parallel, serially connected to the first transistor group, and capable of outputting a predetermined constant current; and
      a third transistor group connected in parallel to the first transistor group, and capable of outputting the second noise cancelling signal.

(5)
The solid-state image capturing element according to (4), further including:
   the third transistor group; and
   a fourth transistor group constituting a current mirror circuit, and capable of adjusting a gain of the second noise cancelling signal to output the adjusted gain.

(6)
The solid-state image capturing element according to any one of (3) to (5), wherein
   the gain changing/inverting circuit and the DA converter are arranged to be adjacent or close to each other.

(7)
The solid-state image capturing element according to any one of (1) to (6), wherein
   the comparator is arranged in a periphery portion of a tip; and
   the DA converter is arranged in a center portion of the tip.

(8)
An electronic device including:
   a pixel array unit in which a plurality of pixels is arranged in array, each of the plurality of pixels outputting a pixel signal;
   a noise-cancelling-signal generating circuit connected to a pixel power source that supplies electric power to the pixels, the noise-cancelling-signal generating circuit configured to:
      generate a first noise cancelling signal for cancelling a power-source noise of the pixel power source; and execute, on the first noise cancelling signal, a gain change and a polarity inversion based on a gain controlling signal to output a second noise cancelling signal;

a DA converter configured to:
generate a reference signal as a ramp signal to output the generated reference signal; and
convert a current of the second noise cancelling signal into a voltage to superpose the converted voltage on the reference signal;

a comparator where the reference signal and the pixel signal are input to a main body part of the comparator via an input capacity connected to one of terminals of a differential pair, the comparator outputting an inversion signal having a timing according to the pixel signal and a gain setting;

a counter that converts an inversion timing of the comparator into a digital value;

a gain controlling unit that outputs, when changing a gradient of the reference signal and the input capacity to execute a gain control on the comparator, the gain controlling signal based on a change amount in the input capacity; and an image-data processing unit that processes image data based on an output from the counter.

REFERENCE SIGNS LIST

10 Solid-state image capturing element
11 Pixel
12 PSRR correcting circuit
13 DA converter
14 ULV comparator
15 Gain controlling unit
16 Load MOS transistor
17 Single-slope AD converter
18 Counter
21 Photodiode
22 Transfer transistor
23 Floating diffusion region
24 Amplifying transistor
25 Selecting transistor
31 Gain changing/inverting circuit
35 Variable current source
36 Output resistance
41 Input capacity variable unit
42 Main body part of comparator
43 Reference-voltage holding capacitor
51 Conductance fixed bias unit
52 Bias unit
53 Input sense unit
54 Phase adjusting unit
55 Phase adjusting unit
56 P-channel MOS transistor
58 Gain adjusting unit
59 Pixel-power-source inputting terminal
73 N-channel MOS transistor
73G P-channel MOS-transistor group
74 P-channel MOS transistor
74 P-channel MOS-transistor group
74G P-channel MOS-transistor group
75 N-channel MOS transistor
75G N-channel MOS-transistor group
76 P-channel MOS transistor
76G P-channel MOS-transistor group
C11, C12, C15 Capacitor
C13, C14 Variable-capacitance capacitor
GC1 to GC3 gain controlling signal
GPW Pixel power source
LC Lower tip
LG Pixel-side current line
LR Reference-side current line
NC0 Noise cancelling signal
NC1 Noise cancelling signal (First noise cancelling signal)
PRC Image-data processing unit
PW Power-source unit
RAMP signal
SW1 to SW5 Switch
TIN Pixel-side input terminal
TTR Reference-signal inputting terminal
TTV Pixel-signal inputting terminal
UC Upper tip
VSL Vertical signal line, Pixel signal
XNC1 Reverse-polarity noise cancelling signal (second noise cancelling signal)

The invention claimed is:

1. A solid-state image capturing element comprising:
a pixel that outputs a pixel signal;
a noise-cancelling-signal generating circuit connected to a pixel power source that supplies electric power to the pixel, the noise-cancelling-signal generating circuit configured to:
generate a first noise cancelling signal for cancelling a power-source noise of the pixel power source; and
execute, on the first noise cancelling signal, a gain change and a polarity inversion based on a gain controlling signal to output a second noise cancelling signal;
a Digital-to-Analog (DA) converter configured to:
generate a reference signal as a ramp signal to output the generated reference signal; and
convert a current of the second noise cancelling signal into a voltage to superpose the converted voltage on the reference signal;
a comparator where the reference signal and the pixel signal are input to a main body part of the comparator via an input capacity connected to one of terminals of a differential pair, the comparator outputting an inversion signal having a timing according to the pixel signal and a gain setting;
a counter that converts an inversion timing of the comparator into a digital value; and
a gain controlling unit that outputs, when changing a gradient of the reference signal and the input capacity to execute a gain control on the comparator, the gain controlling signal based on a change amount in the input capacity.

2. The solid-state image capturing element according to claim 1, wherein
the comparator includes an input capacity changing unit including:
a first capacitor that is connected between an input terminal and one of the terminals of the differential pair;
a plurality of second capacitors whose one ends are connected to the one terminal of the differential pair; and
a plurality of switches that connects in parallel the second capacitors and the first capacitor to each other.

3. The solid-state image capturing element according to claim 1, wherein
the noise-cancelling-signal generating circuit includes:

a pixel-power-source inputting unit to which the pixel power source is connected;

a first noise-cancelling-signal generating unit that converts a pixel-power-source voltage input via the pixel-power-source inputting unit into a current to generate the first noise cancelling signal; and a gain changing/inverting circuit that executes a gain change and a polarity inversion on the first noise cancelling signal based on the gain controlling signal.

4. The solid-state image capturing element according to claim 3, wherein the gain changing/inverting circuit includes:

a first transistor group constituted of a plurality of transistors connected in parallel and through which a current amount proportional to a current amount of the first noise cancelling signal is able to flow;

a second transistor group constituted of a plurality of transistors connected in parallel, serially connected to the first transistor group, and through which a predetermined constant current is able to flow; and a third transistor group connected in parallel to the first transistor group, and capable of outputting the second noise cancelling signal.

5. The solid-state image capturing element according to claim 4, further comprising:

the third transistor group; and a fourth transistor group constituting a current mirror circuit, and capable of adjusting a gain of the second noise cancelling signal to output the adjusted gain.

6. An electronic device comprising:

a pixel array unit in which a plurality of pixels is arranged in array, each of the plurality of pixels outputting a pixel signal;

a noise-cancelling-signal generating circuit connected to a pixel power source that supplies electric power to the pixels, the noise-cancelling-signal generating circuit configured to:

generate a first noise cancelling signal for cancelling a power-source noise of the pixel power source; and execute, on the first noise cancelling signal, a gain change and a polarity inversion based on a gain controlling signal to output a second noise cancelling signal;

a DA converter configured to:

generate a reference signal as a ramp signal to output the generated reference signal; and convert a current of the second noise cancelling signal into a voltage to superpose the converted voltage on the reference signal;

a comparator where the reference signal and the pixel signal are input to a main body part of the comparator via an input capacity connected to one of terminals of a differential pair, the comparator outputting an inversion signal having a timing according to the pixel signal and a gain setting;

a counter that converts an inversion timing of the comparator into a digital value;

a gain controlling unit that outputs, when changing a gradient of the reference signal and the input capacity to execute a gain control on the comparator, the gain controlling signal based on a change amount in the input capacity; and an image-data processing unit that processes image data based on an output from the counter.

* * * * *